United States Patent
Cho et al.

(10) Patent No.: US 6,337,275 B1
(45) Date of Patent: Jan. 8, 2002

(54) METHOD FOR FORMING A SELF ALIGNED CONTACT IN A SEMICONDUCTOR DEVICE

(75) Inventors: Chang-Hyun Cho, Seoul; Kyu-Hyun Lee, Suwon; Jae-Goo Lee, Seoul; Sang-Sup Jeong, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/334,669

(22) Filed: Jun. 17, 1999

(30) Foreign Application Priority Data

Jun. 17, 1998 (KR) .............................. 98-22733

(51) Int. Cl.[7] .............................................. H01L 21/44
(52) U.S. Cl. ........................ 438/675; 438/595; 438/652; 438/655; 438/787
(58) Field of Search ................................ 438/675, 787, 438/791, 258, 655, 305, 595, 652, 257, 622, 592, 264

(56) References Cited

U.S. PATENT DOCUMENTS

| | | | | |
|---|---|---|---|---|
| 5,484,741 A | * | 1/1996 | Bergemont | 438/622 |
| 5,817,562 A | * | 10/1998 | Chang et al. | 438/305 |
| 6,037,223 A | * | 3/2000 | Su et al. | 438/257 |
| 6,069,077 A | * | 5/2000 | Lee et al. | 438/675 |
| 6,074,915 A | * | 6/2000 | Chen et al. | 438/258 |

FOREIGN PATENT DOCUMENTS

GB         2333179         7/1999

OTHER PUBLICATIONS

Y. Kohyama, et al. A Fully Printable, Self–Aligned and Planarized Stacked Capacitor, etc. 1997 Symposium on VLSI Tech. Disgest of Technical Papers, pp. 17 and 18.

* cited by examiner

Primary Examiner—Matthew Smith
Assistant Examiner—Igwe U. Anya
(74) Attorney, Agent, or Firm—The Law Offices of Eugene M. Lee, PLLC

(57) ABSTRACT

A self aligned contact (SAC) pad in a semiconductor device and a method for forming thereof wherein an SAC opening is formed concurrently with single-layer gate spacers. After formation of the stacked gate pattern having a gate electrode and a capping layer disposed thereon, an insulating layer for gate spacers is deposited thereon. An interlayer insulating layer then is deposited over the insulating layer. The interlayer insulating layer has an etch selectivity with respect to the capping layer and insulating layer. SAC then are opened in the interlayer insulating layer while concurrently forming single-layer gate spacers.

8 Claims, 3 Drawing Sheets

METHOD FOR FORMING A SELF ALIGNED CONTACT IN A SEMICONDUCTOR DEVICE

BACKGROUND OF THE INVENTION

1. Field of the Invention

The present invention relates to a contact pad in a semiconductor device and to a method for forming thereof and, more particularly, to a self aligned contact pad and to a method for forming thereof.

2. Description of Related Art

The advance of semiconductor fabricating techniques has now evolved into the gigabit DRAM era. Recently, with the advance of semiconductor fabrication techniques, a trend toward smaller design rules for semiconductor devices such as gigabit DRAMs has proceeded to the extent that the alignment margin can hardly be secured when aligning a contact plug with a semiconductor layer or interconnect layer underlying the contact plug. Accordingly, to manufacture a gigabit DRAM with a critical dimension of 0.18 micrometer or less, a process is employed which permits the contact plug to be formed by self alignment with a semiconductor layer or interconnect layer underlying the contact plug.

The advantage of the self-aligned contact (hereinafter referred to as "SAC") technique is that the misalignment margin of the photolithography process can be increased and the contact resistance can be reduced. For these reasons, emphasis has been placed upon the SAC technique.

FIG. 1 illustrates a cross-sectional view of a conventional semiconductor substrate having a plurality of gate electrodes and contact pads prepared in accordance with a conventional SAC technique. The configuration schematically shown in FIG. 1 is formed by the following process steps. A device isolation region 3 is formed over a semiconductor substrate 1 to define active regions and inactive regions. The device isolation region 3 may be formed by any suitable method well-known in the art for example, shallow trench isolation and local oxidation of silicon. A gate oxide layer (not shown) is formed by a conventional method, e.g., a thermal oxidation method. A gate electrode conductive layer 4a and a gate capping insulating layer 4b are laminated over the gate oxide layer in this order. The gate capping layer 4b has an etch selectivity with respect to subsequently deposited interlayer insulating film 6. Then, the well-known photolithography process is conducted to form gate pattern 4.

Using the gate pattern 4 as a mask, low concentration impurity ions are implanted into the active region of the semiconductor substrate 1. A gate spacer 5 is formed on sidewalls of the gate pattern 4 by the process of depositing a silicon nitride layer and etching back thereof. The gate spacer 5 also has an etch selectivity with respect to the subsequently deposited interlayer insulating film 6. Thereafter, using the gate pattern 4 and spacer 5, high concentration impurity ions are implanted into the active region of the semiconductor substrate 1.

An interlayer insulating film 6 is deposited over the resulting semiconductor substrate 1. A photoresist pattern (not shown) then is deposited over the interlayer insulating film 6. Using the photoresist pattern, exposed interlayer insulating film 6 is etched to form a plurality of contact holes 7a and 7b. The photoresist pattern typically has openings of circular or elliptical configuration.

After removing the photoresist pattern, the contact holes 7a and 7b are filled with conductive material such as polysilicon. The polysilicon layer then is planarized by conventional methods such as chemical mechanical polish (CMP) or etch-back to thereby form a plurality of contact pads 8a and 8b, i.e., bit line contact pad 8b and storage node contact pads 8a.

When the interlayer insulating layer for SAC formation is etched, it is possible that etch stop phenomenon (which denotes that etching by-products cannot easily diffuse out from the SAC opening, so that the rate of SAC etching can significantly slow down) can arise due to the high aspect ratio of the SAC opening. To solve the etch stop phenomenon, the etching must be performed under the condition to suppress the formation of the etching by-product (e.g., polymer) and to increase the etching time. However, if such etching conditions are carried out, the gate capping layer and gate spacer are etched during the etching step, thereby resulting in a short between the SAC pads and gate electrodes.

SUMMARY OF THE INVENTION

The present invention was made in view of the above problems, and it is therefore a feature of the present invention to provide a method for forming a reliable SAC in a semiconductor device without attacking gate spacers and thereby preventing a bridge between gate electrodes and later-formed SAC pads.

In accordance with the present invention, there is provided a method of forming a SAC opening concurrently with the formation of gate spacers. More specifically, after forming the stacked gate pattern with gate electrodes and capping layers thereon, an insulating layer for the gate spacers is deposited thereon. An interlayer insulating layer then is deposited over the insulating layer. The interlayer insulating layer has an etch selectivity with respect to the capping layer and insulating layer. For example, the interlayer insulating layer preferably is made of an oxide layer and the capping layer and insulating layer preferably are made of a nitride layer. A mask pattern is then formed on the interlayer insulating layer, and the interlayer insulating layer and the insulating layer are etched down to the surface of the semiconductor substrate between the stacked gate patterns using the mask pattern, to form a plurality of contact holes while concurrently forming spacers on the sidewalls of the stacked gate patterns.

BRIEF DESCRIPTION OF THE DRAWINGS

The invention may be understood and its features will become apparent to those skilled in the art by reference to the accompanying drawings as follows.

DETAILED DESCRIPTION OF THE PREFERRED EMBODIMENTS

Figure 1:
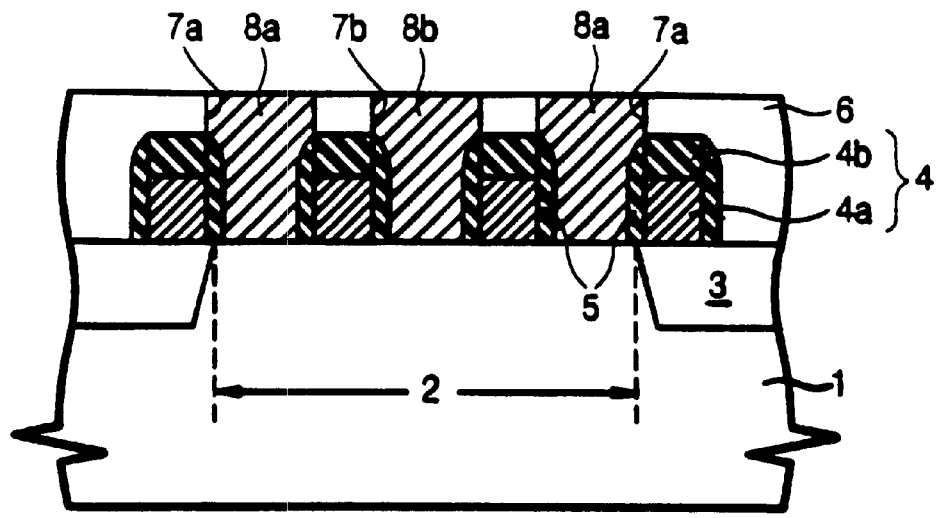
FIG. 1 is a cross-sectional view showing the formation of a SAC in accordance with the conventional method.

Korean Application No. 98-22733, filed Jun. 17, 1998, is hereby incorporated by reference as if fully set forth herein. The aforementioned features and other features evident to those skilled in the art will become readily apparent to those skilled in the art upon review of the detailed description that follows. The preferred embodiments of the present invention will now be described with reference to the accompanying drawings. In the drawings, like numerals denote like embodiments.

Figure 2:
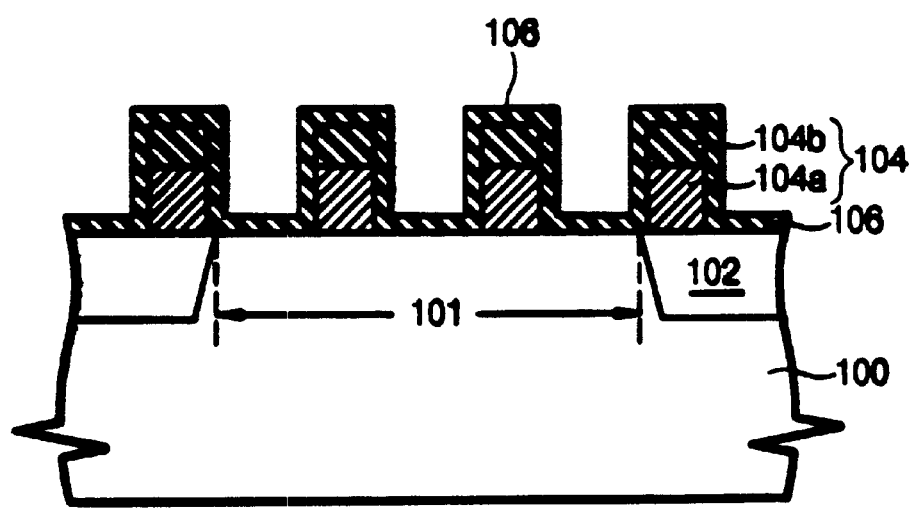
FIGS. 2 to 6 arc flow diagrams illustrating a novel method for forming a SAC pad in accordance with the present invention.

The present invention relates to a method for forming a self aligned contact (SAC) which can prevent the gate capping layer and the sidewall spacer from being attacked and which can prevent the etch stop phenomenon. The gate sidewall spacers preferably are formed simultaneously during etching of the interlayer insulating layer for formation of the SAC opening. FIG. 2 illustrates a cross-sectional view of a cell array region of a semiconductor substrate having a plurality of stacked gate structures and an insulating layer. Active regions 101 and inactive regions are defined in and on the semiconductor substrate 100 by a device isolation layer 102. The inactive regions are those areas on device isolation layer 102 that are not active regions 101 (in FIG. 2, the inactive regions are found on both sides of active region 101).

The device isolation layer preferably is formed by a local oxidation of silicon (LOCOS) technique or trench isolation technique. The active region 101 preferably has a long elliptical configuration. The stacked gate structures 104 usually are conventionally formed on the semiconductor substrate 100. The stacked gate structure 104 includes a plurality of spaced stacked gate patterns each having a gate oxide layer (not shown), a gate electrode 104a and a gate capping layer 104b. The gate oxide layer also can be formed conventionally and usually has a thickness of about 50 Å to 100 Å. A gate conductive layer for gate electrode 104a can be deposited and then the gate capping layer 104(b) can be deposited thereon. Those skilled in the art are capable of depositing the respective gate structures, conductive layers, oxide layers, capping layers, and the like, using the guidelines provided herein.

The respective gate structures, conductive layers, oxide layers, capping layers, and the like, can be made from materials generally employed for such elements, and can be made of varying thicknesses. In a preferred embodiment of the present invention, the gate conductive layer is made of a polysilicon and tungsten silicide layer, and each has a thickness of about 1000 Å. Other metal silicides can also be used instead of tungsten silicide. The gate capping layer 104b preferably is made from a material selected from a material having an etch selectivity with respect to subsequent interlayer insulating layer 108 composed of an oxide layer. The gate capping layer 104b preferably is formed to have a thickness in the range of about 1,000 Å to 2,000 Å. In a preferred embodiment such as that shown in FIG. 2, the gate capping layer 104b has a two layer construction comprising, a silicon nitride layer of about 1,500 Å and an oxide layer of about 500 Å. Skilled artisans are capable of designing an SAC by employing the appropriate materials for the respective layers, such as using an appropriate material for gate capping layer 104b that has the requisite etch selectivity, using the guidelines provided herein.

The gate conductive layer and gate capping layer can be patterned to form the gate electrode structure 104. More particularly, a photoresist layer preferably is spin coated over the gate capping layer and patterned to the desired configuration through exposure and development. Using this patterned photoresist layer, the gate capping layer is etched to form the gate capping pattern 104b. After removing the patterned photoresist layer, using the gate capping pattern 104b, the gate conductive layer then can be etched to form the gate electrode 104a, thereby forming the stacked gate structure 104.

Using the stacked gate structure 104 as a mask, low concentration impurity ions then can be implanted into the active region 101 of the semiconductor substrate 100. An insulating layer 106 for gate spacers then can be deposited over the semiconductor substrate 100 including the stacked gate structure 104. The insulating layer 106 preferably is made of a material which has an etch selectivity with respect to the subsequent interlayer insulating layer (numeral 108 in FIG. 3). For example, the insulating layer 106 preferably is formed to have a thickness of about 300 Å to 1,000 Å. Preferably silicon nitride layer is selected and has a thickness of about 500 Å.

Figure 3:
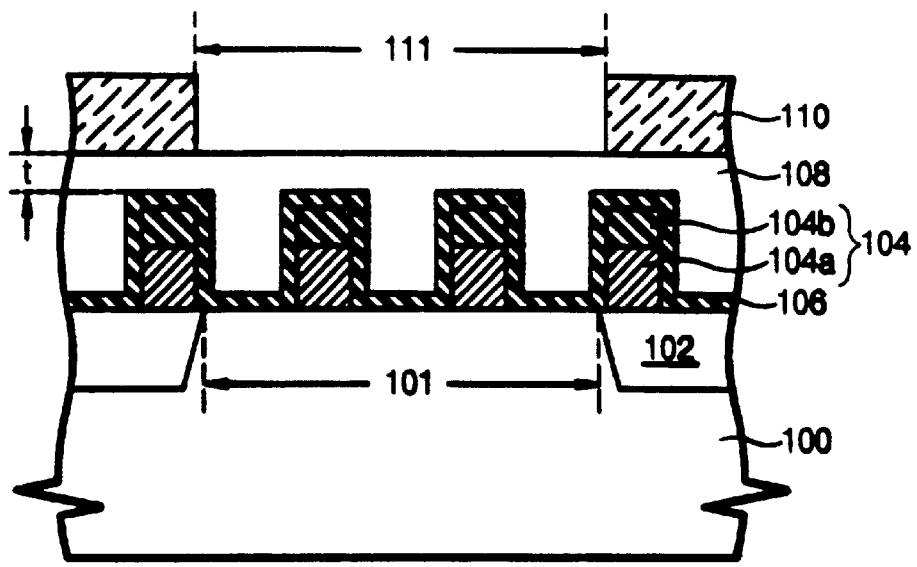

Referring now to FIG. 3, interlayer insulating layer 108 preferably is deposited to fill spaces between the stacked gate structures with a thickness in the range of about 3,000 Å to 9,000 Å. Preferably, the interlayer insulating layer 108 is made of an oxide layer having good gap filling characteristics and has a thickness of about 5,000 Å. A planarization process then can be carried out on the interlayer insulating layer 108 thereby etching a partial thickness thereof to leave behind an interlayer insulating layer 108 having a thickness of about 1,000 Å (see reference numeral "t" of FIG. 3) over the top surface of the gate capping layer 104b.

A photoresist pattern 110 then can be formed over the now planarized interlayer insulating layer 108 to expose a desired portion thereof 111 aligned over the SAC region. As can be seen in FIG. 3, the opening region 111 by the photoresist pattern 110 is aligned over the three contact region, two storage node contact region and one bit line contact region. The opening portion 111 has a "T" configuration including the active region 101 and a portion of inactive region, as seen from a top plan. Alternatively, the opening region by the photoresist pattern may be aligned over only one contact region.

Since the "T" configuration simultaneously exposes bit line contact regions and storage node contact regions, it provides a wide process window for SAC etching. Therefore, the etch stop phenomenon encountered in the conventional method can be avoided.

Y. Kohyama, et al., has proposed a method for forming a SAC pad which utilizes the contact pattern merging a storage node contact and a bit line contact, in the article entitled, "A Fully Printable, Self-aligned and Planarized Stacked Capacitor DRAM Cell Technology for 1 Gbit DRAM and Beyond," Symp. on VLSI Technology Digest of Technical Papers, pp. 17–18, 1997. In the above article by Y. Kohyama et al., however, the gate SAC pattern (which indicates resist area) is the same as the active area and is shifted by a half pitch to the gate direction. Therefore, the photoresist pattern area is so small that only a small amount of polymer is produced during SAC etching. As a result, the interlayer insulating film and the nitride layer of gate spacer and gate capping layer have poor etch selectivity with respect to each other. This is because the polymer formation is proportional to the photoresist pattern area.

In accordance with the present invention, however, areas occupied by the photoresist pattern are larger than that suggested by Y. Kohyama et al., so that etch selectivity between the nitride layer and oxide layer is improved.

Figure 4:
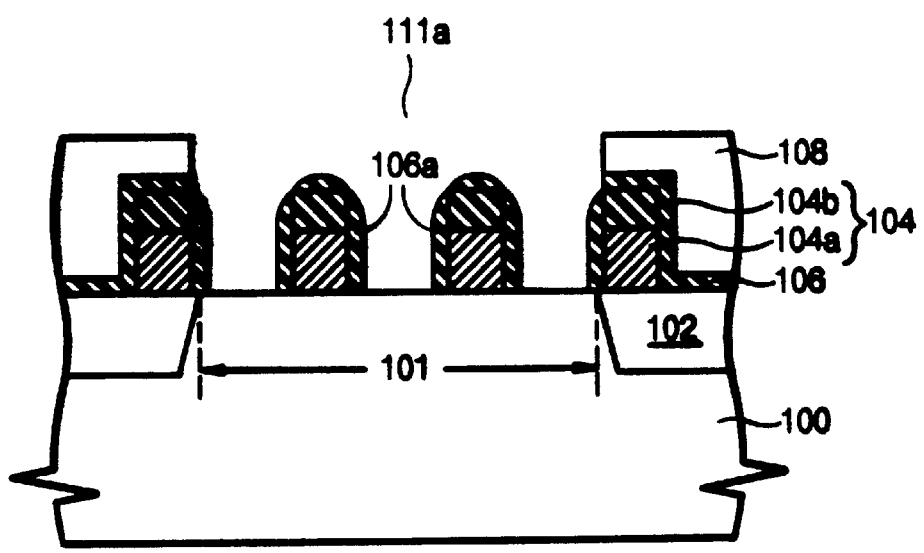

Using the photoresist pattern 110 as a mask, the interlayer insulating layer 108 and the insulating layer 106 can be etched to thereby form SAC openings 111a concurrently with the formation of gate spacers 106a (see, FIG. 4). More specifically, the interlayer insulating layer 108 is etched selectively with respect to the insulating layer 106 (which serves as an etching stopper). After that, the insulating layer 106 is etched back to form the SAC openings 111a and gate spacers 106a simultaneously. Attacking of the gate spacers 106a encountered in the conventional method, does not inherently occur according to the present invention. After the SAC openings 111a are formed, impurity ions implantation can be carried out on the exposed semiconductor substrate outside of the stacked gate with spacers so as to reduce contact resistance.

Figure 5:
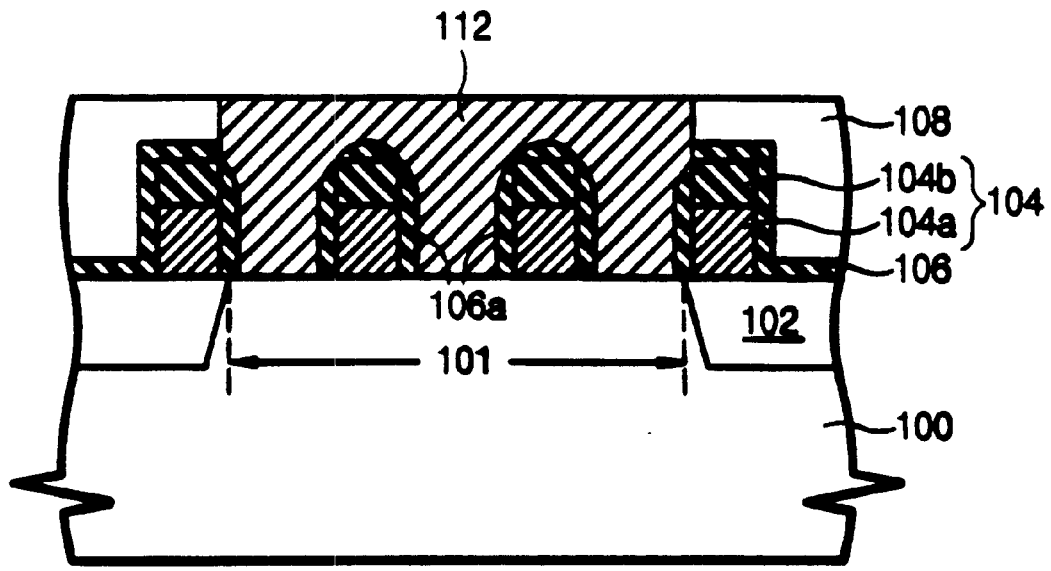

Referring now to FIG. 5, after removing the photoresist pattern 110, a conductive layer, such as polysilicon 112, preferably is deposited over the interlayer insulating layer 108 to fill the SAC openings 111a. For example, a polysilicon conductive layer 112 can be deposited to a thickness of about 3,000 Å to 7,000 Å. After that, a planarization process can be carried out to remove the polysilicon conductive layer over the interlayer insulating layer 108 while leaving behind the polysilicon conductive layer 112 in the SAC openings, as shown in FIG. 5. The planarization process may be CMP or etch back. The CMP typically uses slurry conventional to polysilicon. Skilled artisans are capable of planarizing conductive layers, preferably polysilicon conductive layers, using the guidelines provided herein.

Figure 6:
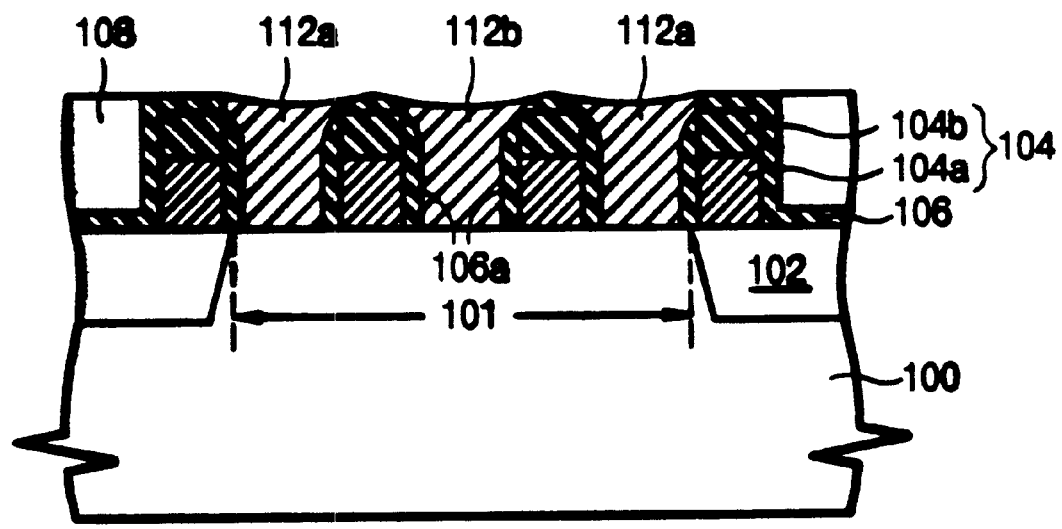

The interlayer insulating layer 108 and the polysilicon layer 112 then can be simultaneously removed by a planarization process until the top surface of the gate capping layer 104b is exposed so as to electrically isolate each contact pads, as shown in FIG. 6. Again, the planarization process may be CMP which uses slurry conventional to oxide.

If the opening region 111 (FIG. 3) only exposes one contact region, either a storage node or a bit line, the aforementioned planarization process for electrical isolation is not necessary.

It will be recognized by those skilled in the art that the innovative concepts disclosed in the present application can be applied in a wide variety of contexts. Moreover, the preferred implementation can be modified in a tremendous variety of ways. Accordingly, it should be understood that the modification and variations suggested below and above are merely illustrative. These examples may help to show some of the scope of the inventive concepts, but these examples do not nearly exhaust the full scope of variation in the disclosed novel concepts.

What is claimed is:

1. A method for forming a self aligned contact in a semiconductor device, comprising:

forming a plurality of spaced-apart, stacked gate patterns over a semiconductor substrate;

forming an insulating layer on the semiconductor substrate including the stacked gate pattern;

forming an interlayer insulating layer on the insulating layer;

forming a mask pattern on the interlayer insulating layer;

etching the interlayer insulating layer and the insulating layer down to the surface of the semiconductor substrate between the stacked gate patterns using the mask pattern, to form a plurality of contact holes while concurrently forming single-layer spacers on sidewalls of the stacked gate patterns.

2. The method according to claim 1, further comprising removing the mask pattern and filling the contact holes with a conductive material.

3. The method according to claim 1, wherein each of the stacked gate patterns includes a gate conductive layer and a gate capping layer thereon.

4. The method according to claim 3, wherein the gate capping layer and the insulating layer have an etch selectivity with respect to the interlayer insulating layer.

5. The method according to claim 3, wherein the gate capping layer and the insulating layer are each made of a nitride compound.

6. The method according to claim 3, wherein the gate capping layer has a thickness in the range of about 1,000 Å to 2,000 Å, and the insulating layer has a thickness in the range of about 300 Å to 1,000 Å.

7. The method according to claim 1, further comprising planarizing the interlayer insulating layer prior to forming the mask pattern over the interlayer insulating layer.

8. The method according to claim 1, wherein at least one of the contact holes exposes at least two different contact regions.

* * * * *